United States Patent
Van Winkelhoff et al.

(10) Patent No.: US 9,837,141 B2
(45) Date of Patent: Dec. 5, 2017

(54) READ ASSIST CIRCUITRY FOR A MEMORY DEVICE

(71) Applicant: ARM Limited, Cambridge (GB)

(72) Inventors: Nicolaas Van Winkelhoff, Grenoble (FR); Mikael Brun, Grenoble (FR); Fabrice Blanc, Grenoble (FR)

(73) Assignee: ARM Limited, Cambridge (GB)

( * ) Notice: Subject to any disclaimer, the term of this patent is extended or adjusted under 35 U.S.C. 154(b) by 22 days.

(21) Appl. No.: 14/745,355

(22) Filed: Jun. 19, 2015

(65) Prior Publication Data

US 2015/0371686 A1    Dec. 24, 2015

(30) Foreign Application Priority Data

Jun. 20, 2014    (GB) .................................. 1411023.3

(51) Int. Cl.

| | |
|---|---|
| *G11C 7/00* | (2006.01) |
| *G11C 7/22* | (2006.01) |
| *G11C 11/418* | (2006.01) |
| *G11C 5/14* | (2006.01) |
| *G11C 8/10* | (2006.01) |
| *G11C 8/08* | (2006.01) |

(52) U.S. Cl.
CPC .............. *G11C 11/418* (2013.01); *G11C 5/14* (2013.01); *G11C 7/00* (2013.01); *G11C 8/08* (2013.01); *G11C 8/10* (2013.01)

(58) Field of Classification Search
CPC ........... G11C 11/418; G11C 5/14; G11C 7/00; G11C 8/08; G11C 8/10

USPC ....... 365/154, 156, 185.23, 189.011, 230.06, 365/206; 257/202
See application file for complete search history.

(56) References Cited

U.S. PATENT DOCUMENTS

| 4,584,674 A * | 4/1986 | Watanabe ........... G11C 11/4087 365/230.06 |
| 4,757,218 A * | 7/1988 | Nawaki .................... G11C 8/08 365/206 |
| 6,198,685 B1 * | 3/2001 | Sudo ........................ G11C 8/08 365/230.06 |
| 7,482,644 B2 * | 1/2009 | Eggers ................... G11C 29/02 257/202 |
| 8,270,222 B2 * | 9/2012 | Liao ......................... G11C 8/14 365/230.06 |
| 8,483,006 B1 | 7/2013 | Chou et al. |

(Continued)

OTHER PUBLICATIONS

UKIPO Search Report; GB 1411023.3; Dec. 9, 2014.

*Primary Examiner* — Toan Le
(74) *Attorney, Agent, or Firm* — Pramudji Law Group PLLC; Ari Pramudji

(57) ABSTRACT

A memory device is provided which comprises an array of bitcells and a plurality of wordlines. Each bitcell of the array of bitcells is selectively coupled to a wordline of the plurality of wordlines and access to a selected bitcell of the array of bitcells requires an asserted voltage on a selected wordline with which the selected bitcell is associated. Read assist circuitry is provided, which is configured, when read access to the selected bitcell is carried out, to implement a reduction in the asserted voltage on the selected wordline, and wherein the read assist circuitry is configured to implement the reduction in the asserted voltage by selective connection of the selected wordline to a further wordline of the plurality of wordlines.

13 Claims, 12 Drawing Sheets

(56) References Cited

U.S. PATENT DOCUMENTS

| | | | |
|---|---|---|---|
| 8,547,757 B2* | 10/2013 | Liu | G11C 7/02 |
| | | | 365/189.011 |
| 8,565,036 B2* | 10/2013 | Kitayama | G11C 7/02 |
| | | | 365/230.06 |
| 8,848,461 B2* | 9/2014 | Chang | H01L 21/78 |
| | | | 365/154 |
| 8,982,609 B2* | 3/2015 | Yang | G11C 11/4094 |
| | | | 365/154 |
| 9,236,113 B2* | 1/2016 | Holla | G11C 11/413 |
| 9,236,116 B1* | 1/2016 | Braceras | G11C 11/419 |
| 2002/0196058 A1 | 12/2002 | Takahashi | |
| 2007/0030741 A1 | 2/2007 | Nii et al. | |
| 2008/0037358 A1 | 2/2008 | Yabuuchi et al. | |
| 2010/0054052 A1 | 3/2010 | Kodama et al. | |
| 2010/0165770 A1* | 7/2010 | Matsuoka | G11C 8/10 |
| | | | 365/207 |
| 2012/0075918 A1 | 3/2012 | Arsovski et al. | |
| 2012/0307574 A1 | 12/2012 | Cheng et al. | |
| 2012/0327727 A1* | 12/2012 | Wang | G11C 11/417 |
| | | | 365/189.16 |
| 2013/0100730 A1* | 4/2013 | Chang | G11C 8/08 |
| | | | 365/154 |

\* cited by examiner

US 9,837,141 B2

READ ASSIST CIRCUITRY FOR A MEMORY DEVICE

FIELD OF THE INVENTION

The present invention relates to a memory device. More particularly, it relates to read assist techniques when operating the memory device.

BACKGROUND OF THE INVENTION

As contemporary memories have progressed towards ever smaller process scales and lower operating voltages, it is known that it may be necessary to take steps to ensure that read stability is maintained. This relates to the fact that the configuration of a contemporary memory may be at a level where the access disturbance margin (ADM) or static noise margin (SNM) may be such that the action of reading a data bit held by a bit cell of the memory may cause the value of that data bit to change. Such lowered stability can for example result from process variation or low operating voltages.

One known technique for addressing this problem is to lower the voltage applied to the relevant word line for at least part of the read process. By applying a lower voltage to the bit cell access ports (pass gates), in particular during the early portion of the read process, the internal nodes are less disturbed and the bit cell is more stable. Various techniques are known for achieving this lowered voltage on the word line, such as charge injection/extraction solutions, which seek to vary the word line voltage by selectively connecting a capacitive element to it, yet these known techniques are susceptible to process and temperature variation. Moreover, the timing of the application of the "read assist" wordline voltage lowering can be critical.

It would be desirable to provide a technique which enabled such read assist wordline voltage lowering to be implemented, which is less sensitive to temperature and process variations, and is more flexible with regards to timing.

SUMMARY OF THE INVENTION

Viewed from a first aspect, the present invention provides a memory device comprising an array of bitcells; a plurality of wordlines, wherein each bitcell of the array of bitcells is selectively coupled to a wordline of the plurality of wordlines and access to a selected bitcell of the array of bitcells requires an asserted voltage on a selected wordline with which the selected bitcell is associated; and read assist circuitry configured, when read access to the selected bitcell is carried out, to implement a reduction in the asserted voltage on the selected wordline, wherein the read assist circuitry is configured to implement the reduction in the asserted voltage by selective connection of the selected wordline to a further wordline of the plurality of wordlines.

The memory device according to the present techniques is provided with read assist circuitry which is configured to selectively reduce the voltage asserted on a given wordline. In particular, the read assist circuitry is configured to apply this reduction when read access to a selected bit cell coupled to that selected wordline is required. Rather than seeking to achieve this reduction in the voltage by, for example, connecting the selected wordline to ground, the read assist circuitry of the present techniques is configured to selectively couple the selected word line to another wordline of the plurality of wordlines which are provided in the memory device. This technique recognises that when the word line voltage is asserted on a selected wordline the other wordlines in the memory device are inactive, and in particular will usually be being held at ground voltage and therefore may also be used as a suitable "ground" connection for enabling a reduction in the asserted voltage on the selected wordline to be implemented. In general, the wordlines within a memory device are provided in close proximity to one another and this means that the present technique may be implemented with relatively little disturbance to the layout of a tightly configured memory device.

In some embodiments the read assist circuitry is configured to implement the reduction in the asserted voltage on the selected wordline by additional selective connection of the selected wordline to a second further wordline of the plurality of wordlines. Thus in order to reduce the asserted voltage on a selected wordline the read assist circuitry not only selectively connects the selected wordline to a first other wordline, but also selectively couples the selected wordline to a second other wordline. In other words, the reduction in the asserted voltage on the selected wordline is achieved by connecting the selected wordline to two other wordlines. Given that the connection of the selected wordline to the other wordline or wordlines will typically be made by means of a transistor connection, a configuration in which the selective connection of the selected wordline is made to two other wordlines then means that the transistor provided for each connection can be half the size of, for example, a single transistor connection to ground. In other words, the reduction in the asserted voltage on the selected wordline can then be achieved using half the transistor length, with the same result, thus supporting a particularly dense layout configuration.

The further wordline to which the selected wordline is connected in order to implement the reduction in the asserted voltage may be arranged variously with respect to the selected wordline, but in some embodiments the further wordline of the plurality of wordlines is adjacent to the selected wordline. This supports a dense layout configuration.

Similarly, the second further wordline to which the selective wordline is connected in some embodiments may also be arranged variously with respect to the selected wordline, but in some embodiments the second further wordline of the plurality of wordlines is adjacent to the selected wordline.

In some embodiments the read assist circuitry further comprises a selectable connection between the further wordline and the second further wordline of the plurality of wordlines. In other words, where the read assist circuitry is configured to implement the reduction in the asserted voltage on the selected wordline by connecting the selected wordline to two other wordlines, there may also be provided a selectable connection between those two other wordlines. This therefore establishes the set of three wordlines as a cyclical set, wherein any one of those wordlines can be the selected wordline on which a read access is made, whilst the other two wordlines then can play the role of the unasserted ("ground") rails to which the read assist circuitry connects the selected wordline in order to implement the reduction in the asserted voltage. Grouping the wordlines together in this manner also means that a special status for wordlines which do not have a further (say, neighbouring) wordline to which they can be connected (such as those wordlines at the edge of the memory device or at the edge of a bank within the memory device) are avoided, and particular techniques to deal with such "edge effects" are not necessary.

Such a "cyclical" configuration of the manner in which the wordlines are selectively connectable to one another by the read assist circuitry may take a variety of forms, but in some embodiments the read assist circuitry comprises a set of selectable connections between adjacent wordlines of a set of at least three adjacent wordlines, wherein the set comprises the selected wordline and the read assist circuitry comprises a further selectable connection between two outermost wordlines in the set. Accordingly, groups of adjacent wordlines within the memory device can thus be grouped together. Whilst there must be at least three adjacent wordlines for such a cyclical configuration to be possible, in one embodiment the set of at least three adjacent wordlines is a set of four adjacent wordlines. This configuration of the memory device is useful in the context of providing an easily configurable layout, since four is a power of two and the iterative, hierarchical nature of the layout of a contemporary memory device is thus well supported.

In some embodiments the read assist circuitry comprises a voltage divider configured to generate at a midpoint of the voltage divider a mid-voltage between a first reference voltage and a second reference voltage, wherein the midpoint of the voltage divider is connected to the selected wordline. Using a voltage divider (resistor divider) supports a relatively simple configuration of the provision of the read assist circuitry and moreover, the fact that such a voltage resistor divider can be composed of the same transistor components as the bit cells of the memory device means that the performance of the voltage divider can be particularly stable with respect to process and temperature variation. Moreover, by providing a definite voltage level at its midpoint which is applied to the selected wordline the constraints on the timing of the assertion of the read assist signal (which causes the selective connection of the selected wordline to the further wordline) are more relaxed since even if the read assist signal is applied "late" (i.e. after the wordline has already risen above the intended reduced level), this overshoot will be immediately corrected for. It should be understood that here the use of the terms "mid-voltage" and "midpoint" does not necessarily imply any equal division of the voltage range spanned between the first reference voltage and the second reference voltage, but rather any voltage that lies within that range—in dependence on the particular configuration of the voltage divider.

Although the wordlines of the memory device may be grouped together in the above-mentioned cyclical grouping configuration, for example in order to avoid "edge" wordline issues, in some embodiments the read assist circuitry further comprises a selectable connection between the selected wordline and the second reference voltage, wherein the selectable connection between the selected wordline and the second reference voltage is configured to provide that the first reference voltage and the second reference voltage are each coupled to separate transistor wells. This technique enables such an "edge" wordline to be provided in the memory device and furthermore to be selectively connected to the second reference voltage (i.e. typically to ground). In the context of the voltage divider providing its mid-voltage from its midpoint to the selected wordline, the present techniques recognise that this could potentially represent an electrostatic discharge (ESD) risk due to the effective proximity of the first reference voltage (e.g. VDD) to the second reference voltage (e.g. VSS), and potentially, depending on the layout, sharing a single transistor well. One way of addressing this would be to make a strong local well contact which would avoid this transistor (PNP junction) from being opened by an electrostatic discharge. However, where for example back-biasing of the transistor gates of the memory device is desirable such a strong local well contact is not possible. The provision of the selectable connection between the selected wordline and the second reference voltage such that the first reference voltage and the second reference voltage are each coupled to separate transistor wells, for example by the addition of a NMOS transistor, provides protection for the memory device against such ESD problems.

Whilst the voltage divider could be configured in a variety of ways, in some embodiments an upper portion of the voltage divider arranged between the first reference voltage and the midpoint comprises a first type of transistor forming part of a wordline driver coupled to the selected wordline. As such, the upper portion of the voltage divider is thus advantageously already provided by a component of the wordline driver and thus a particularly compact configuration and layout is supported. For example, the wordline driver typically comprises an inverter formed by the pairing of a PMOS and NMOS transistor pair, and the upper portion of the voltage divider can be provided by the PMOS device.

Similarly, in some embodiments a lower portion of the voltage divider arranged between the midpoint and the second reference voltage comprises a second type of transistor forming part of a wordline driver coupled to the further wordline. In the above example of the wordline driver comprising an inverter, the second type of transistor may therefore be provided by the NMOS device in the wordline driver.

The first type of transistor may be a PMOS transistor. The second type of transistor may be an NMOS transistor.

The control over the selected connection of the selected wordline to a further wordline of the plurality of wordlines may be generated entirely internally to the memory device, for example by a control unit of the memory device itself, but in some embodiments the selective connection of the selected wordline to a further wordline of the plurality of wordlines is controlled by a control signal provided externally to the memory device. The ability to thus control the assertion of the read assist signal from external to the memory device provides an useful degree of control, which is not present in configurations in which the read assist lowering of the wordline voltage is provided by other techniques, in particular where the configuration of any read assist circuitry forms part of the predetermined layout of the memory device. Thus, whilst in many prior art techniques the read assist functionality needs to be determined by the memory designer before the layout was turned into a silicon device, the present techniques allow the engineer testing a memory device (which is already embodied in silicon) to vary aspects of the read assist technique described herein, both in terms of the timing and level of the control signal.

Viewed from a second aspect, the present invention provides a memory bitcell comprising: data-bit storage circuitry; a wordline, wherein the data-bit storage circuitry is configured to be selectively coupled to the wordline and access to a the memory bitcell requires an asserted voltage on the wordline; and read assist circuitry configured, when read access to the memory bitcell is carried out, to implement a reduction in the asserted voltage on the wordline, wherein the read assist circuitry is configured to implement the reduction in the asserted voltage by selective connection of the wordline to a further wordline which does not form part of the memory bitcell.

Viewed from a third aspect the present invention provides a computer-readable storage medium on which is stored a cell library, the cell library including a cell definition of a memory bit according to the second aspect. The computer-readable storage medium can take a variety of forms, including both non-transitory and transitory forms, but in one embodiment is a non-transitory computer storage medium.

Viewed from a fourth aspect the present invention provides a method of operating memory device comprising: storing data in an array of bitcells; coupling a selected wordline from amongst a plurality of wordlines to a selected bitcell of the array of bitcells when access to the selected bitcell is required; applying an asserted voltage on the selected wordline; implementing, when read access to the selected bitcell is carried out, a reduction in the asserted voltage on the selected wordline, wherein the reduction in the asserted voltage is implemented by selective connection of the selected wordline to a further wordline of the plurality of wordlines.

Viewed from a fifth aspect the present invention provides a memory device comprising means for storing data in an array of bitcells; means for coupling a selected wordline from amongst a plurality of wordlines to a selected bitcell of the array of bitcells when access to the selected bitcell is required; means for applying an asserted voltage on the selected wordline; means for implementing, when read access to the selected bitcell is carried out, a reduction in the asserted voltage on the selected wordline, wherein the reduction in the asserted voltage is implemented by selective connection of the selected wordline to a further wordline of the plurality of wordlines.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
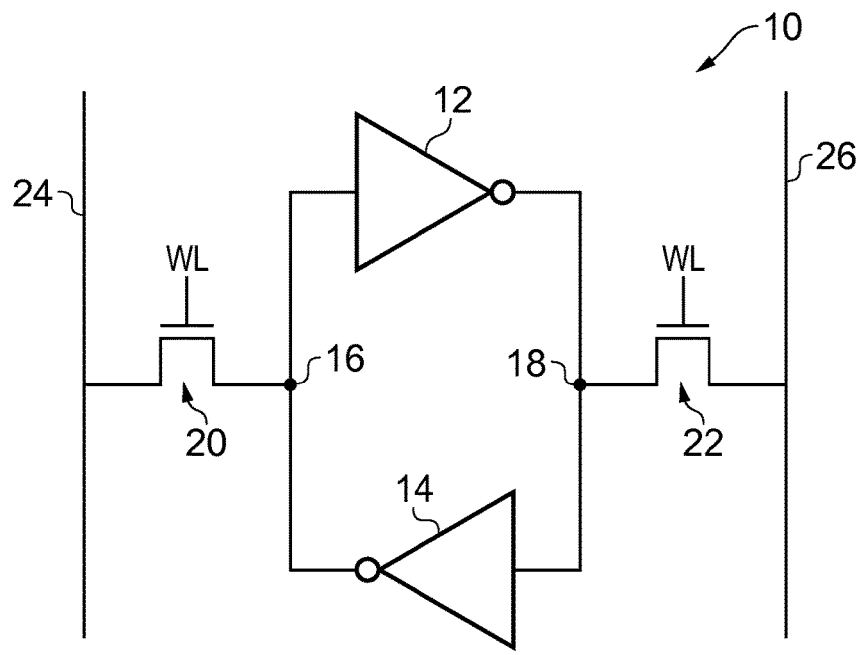
FIG. 1 schematically illustrates a known memory bit cell.
Figure 2:
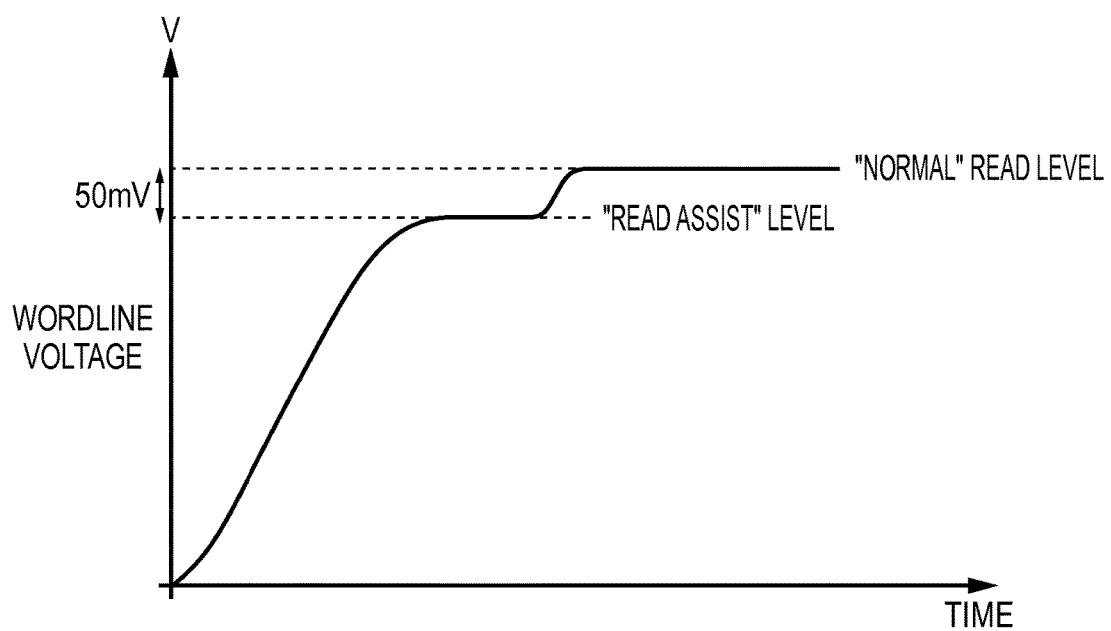
FIG. 2 shows a known example of the reduction in the wordline voltage to a "read assist" level.

FIG. 1 schematically illustrates a known memory cell 10 which essentially consists of a pair of cross-coupled inverters 12 and 14. The configuration of these inverters 12 and 14 is such that the bit cell 10 can stably hold a pair of complementary values at the nodes 16 and 18. A pair of access transistors 20, 22 couples the nodes 16, 18 to the bit lines 24, 26 to enable the pair of values held at the nodes 16, 18 to be written and read out. In order to improve the read stability of the bit cell 10, when a read operation is carried out in FIG. 1, the word line (WL) voltage (V) is asserted, e.g., as is shown in FIG. 2, wherein the wordline (WL) voltage (V) is temporarily held back from reaching a "normal" read level at a "read assist" level which is approximately 50 mV below it. The graph of FIG. 2 shows wordline (WL) voltage (V) along a y-axis versus time along an x-axis. One of ordinary skill in the art will be familiar with the manner in which this reduction in the word line (WL) read voltage (V) helps to prevent the content of the bit cell 10 from being disturbed by the read process and further description thereof is dispensed with here for brevity.

Figure 3:
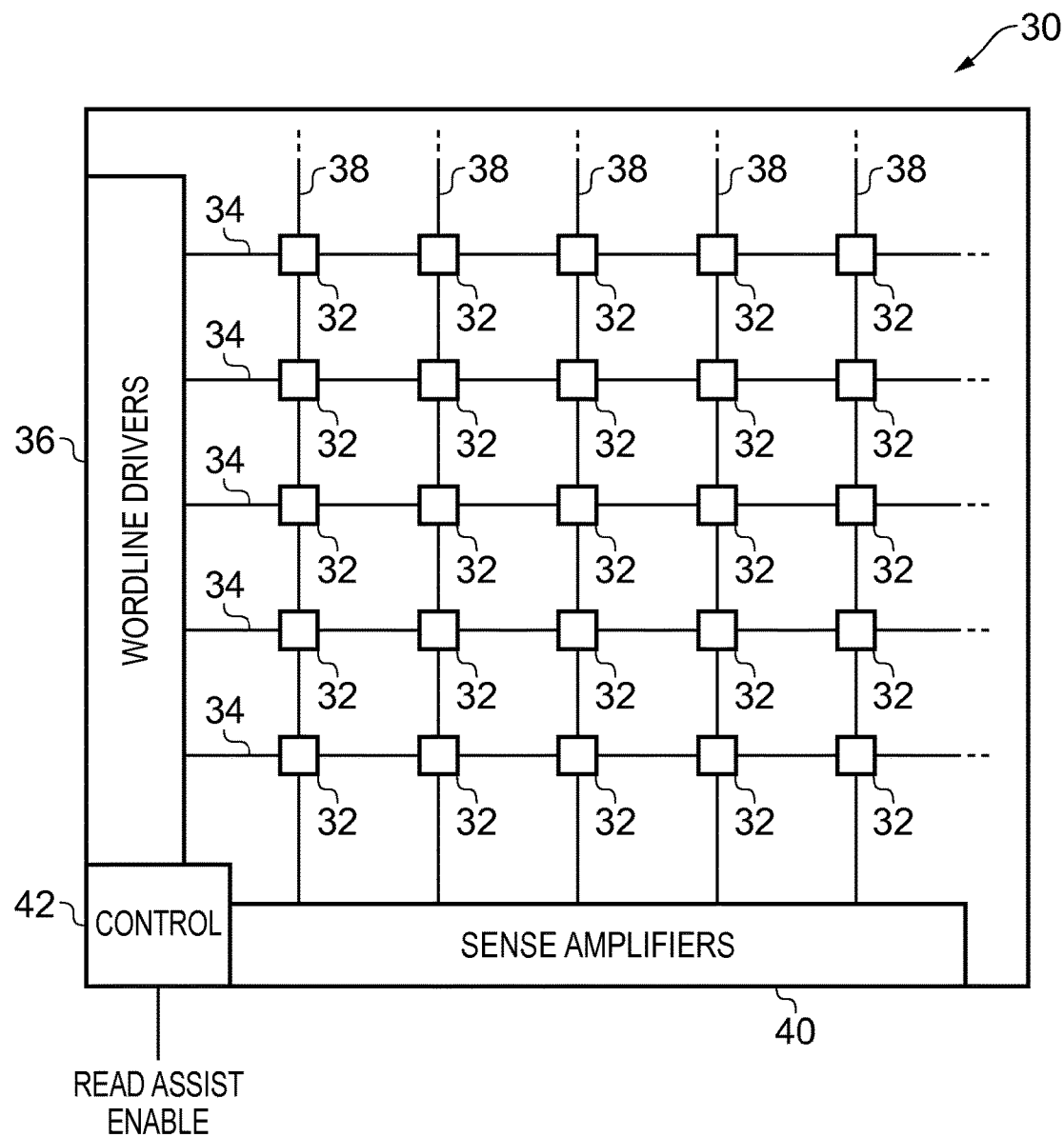
FIG. 3 schematically illustrates a memory device in one embodiment.

FIG. 3 schematically illustrates a memory device 30 in one embodiment. The memory device 30 comprises an array of bit cells 32, of which it will be recognised that only a small proportion are illustrated in the figure for clarity and the memory device will in reality comprise many more such bit cells. Each bit cell 32 is coupled to a wordline 34 driven by a set of wordline drivers 36, and to at least one bit line 38 the voltage of which is measured by a set of sense amplifiers 40. It will be recognised by one of ordinary skill in the art that FIG. 3 only represents a high level representation of the memory array and many variations thereon, for example where each bit cell is coupled to a pair of bit lines, may be provided. Such variants are also within the scope of the present invention, in that they do not affect the principle of the present techniques. The memory device 30, further comprises a control unit 42 which maintains overall control of the memory device, and in particular the word line drivers 36, the sense amplifiers 40 and the read assist circuitry (not illustrated in this figure). In addition, the memory device is configured to receive a read assist enable signal which is provided externally to the memory device 30 and causes the read assist circuitry to be selectively activated. Accordingly, in the embodiment shown, the use of the read assist circuitry may be controlled by a user even after the memory device 30 has been physically constructed. Nevertheless, such a configuration is not necessary and the read assist enable signal could also for example be generated within the control unit 42 as part of its overall control of the memory device 30.

Figure 4A:
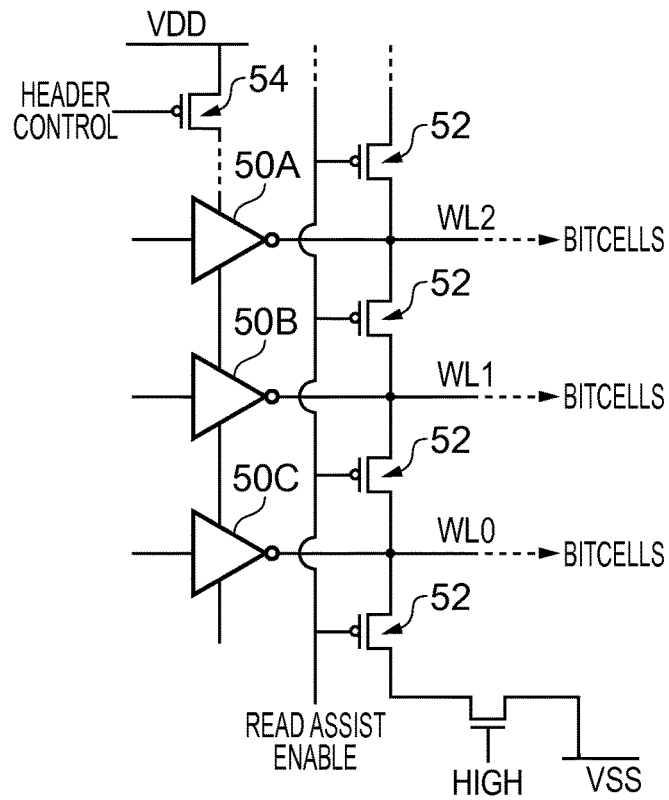
FIG. 4A schematically illustrates the configuration of three wordlines and the associated read assist circuitry in one embodiment.

FIG. 4A schematically illustrates in more detail the configuration of a portion of a memory device in one embodiment. Three wordlines (WL0, WL1, WL2) are shown which each control the access to a respective set of bit cells. Each wordline is controlled by a wordline driver 50A, 50B, 50C which asserts a voltage on the respective wordline to enable that access to occur. The configuration shown also comprises a number of PMOS transistors 52 which form part of the read assist circuitry for this memory device and selectively connect the wordlines to one another. The gate of each of these PMOS transistors 52 is coupled to a line which carries the read assist enable signal by means of which the selective connection between the wordlines can be made. It will be understood therefor that the labelled "read assist enable" signal is an "active low" signal. Also shown in FIG. 4A is a further PMOS transistor 54 which acts as a header transistor for the illustrated set of wordline drivers to let them be enabled and disabled as a group. This header transistor 54 is controlled by a header control signal which can be provided by a centralised control unit such as the control unit 42 shown in FIG. 3. Additionally, FIG. 4A shows that the last PMOS transistor 52 (viewing the figure from top to bottom) couples the wordline WL0 to VSS via an NMOS transistor, the gate of which is tied high. This configuration avoids the risk of a relatively direct connection between VDD in the lowest wordline driver 50C and VSS, in particular such that VDD and VSS are coupled to separate transistor wells, thus mitigating against a potential electrostatic discharge (ESD) risk for this device. Further, in some embodiments, this configuration shown for WL0 may also be applied to an uppermost PMOS transistor 52 (viewing the figure from top to bottom) that couples an uppermost wordline WLN to VSS via another NMOS transistor, the gate of which is also tied high.

Figure 4B:
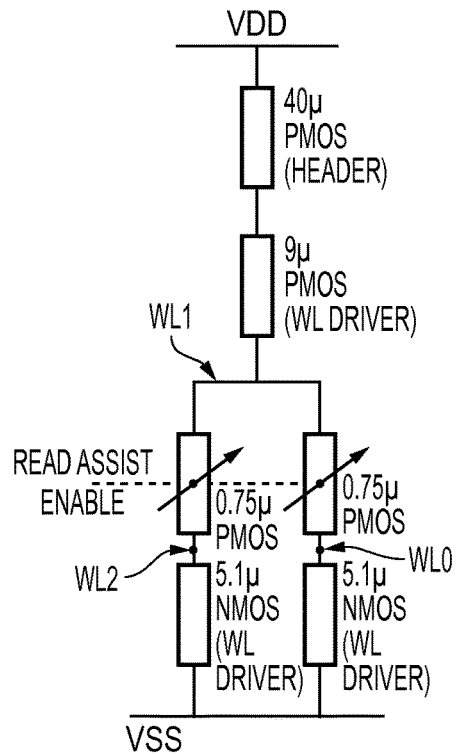
FIG. 4B schematically illustrates another representation of part of the configuration of FIG. 4A in one embodiment.

FIG. 4B schematically illustrates another representation (in terms of a voltage divider) of the configuration shown in FIG. 4A. Here, the PMOS transistor 54 is represented by a 40.mu. PMOS, whilst a PMOS transistor in one of the wordline drivers 50B is represented by a 9.mu. PMOS. It should be noted that the references to the sizes of components here (e.g. "40.mu.") are to transistor width and not to resistance. Accordingly a larger value here corresponds to greater conductance. Two further 0.75.mu. PMOS transistors are provided (as will be described in more detail below) coupling wordline WL1 to wordlines WL2 and WL0 respectively, and a path from these wordlines to VSS is provided by two further 5.1.mu. NMOS transistors, which also form part of the wordline drivers 50A and 50C respectively (as will also be described in more detail below). The 0.75.mu. PMOS transistors which embody the read assist selective control gates 52 in this embodiment are controlled by the read assist enable signal (active low). As illustrated, WL0 and WL2 thus provide a virtual ground (at about 5 mV). Note further that the 0.75.mu. PMOS transistors providing the read assist selective control gates in this embodiment are shown as variable resistors in FIG. 4B. As such, whilst the read assist enable signal may be embodied as a binary (0/1) signal, it should be appreciated that it can be also implemented as an analogue signal. Then, either by varying (in design) the size of these transistors (resistors) or by varying their gate voltage, these "resistors" can be tuned to give a particular switching performance.

Figure 5:
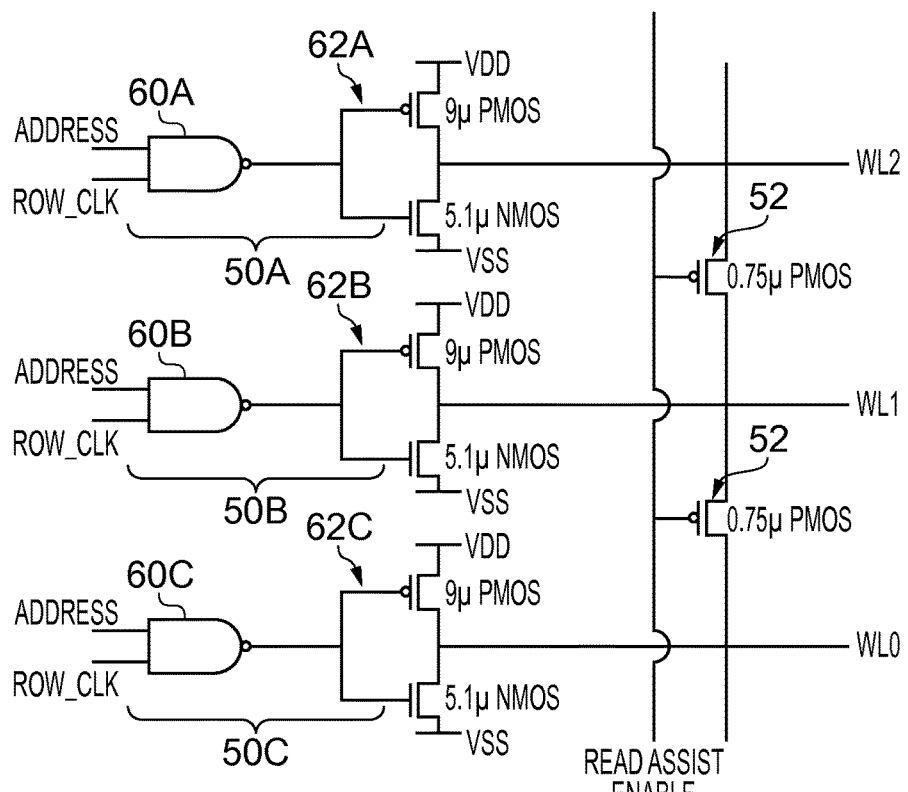
FIG. 5 schematically illustrates the configuration of three wordlines and the associated read assist circuitry in one embodiment.

FIG. 5 schematically illustrates in more detail some of the components which are represented in FIG. 4A. As can be seen in FIG. 5, each wordline driver 50A, 50B, 50C is composed of a NAND gate 60A, 60B, 60C which each take an address signal and a clock signal (ROW_CLK) for that wordline as its inputs, and these NAND gates provide the input for an inverter 62A, 62B, 62C which is formed of a PMOS/NMOS pair. In the embodiment illustrated the PMOS transistors are 9μ devices, whilst the NMOS transistors are 5.1μ devices.

Taking the example where the wordline WL1 is asserted, this occurs when the address corresponding to a bit cell coupled to this wordline is asserted and the ROW_CLK signal corresponding to this row of bit cells is also asserted, thus providing a low output from the NAND gate 60B. This is then inverted by inverter 62B providing the required asserted voltage on wordline WL1 for its bit cells to be accessed. According to the present techniques, when the access for this wordline is a read access, use is also made of the PMOS transistors 52, which in this illustrated embodiment are provided by 0.75μ devices, in order to couple the wordlines to one another. This occurs when the read assist enable signal is asserted (active low), the timing of which will be discussed in more detail below. In the example where wordline WL1 is asserted, the additional assertion of the read assist enable signal thus couples the wordline WL1 to the midpoint of a voltage divider between VDD and VSS provided by a 9μ PMOS in the inverter 62B and two 5.1μ NMOS transistors in the inverters 62A and 62C. It will be recognised that this is also alternatively represented in FIG. 4B (although the 40μ header PMOS transistor is not illustrated in the example of FIG. 5).

This thus enables the asserted voltage on wordline WL1 to be reduced and therefore for the desired read assist functionality to be provided. It should be appreciated moreover that this functionality has therefore been provided only by the additional provision of the set of PMOS transistors 52 which couple the wordlines together and the associated read assist enable signal line, since the 9.mu. PMOS and 5.1.mu. NMOS transistors which are made use of to provide the functionality of the voltage divider are already present in the inverters 62A, 62B, 62C of the wordline drivers 50A, 50B, 50C. As a result, the read assist functionality is supported according to the present techniques with the addition of components which do not increase the layout area to any significant extent of a known wordline driver configuration. In the embodiment illustrated in FIG. 5, the inverters 62A, 62B, 62C and the PMOS transistors 52 (together with the read assist enable signal line which controls them) thus provide the read assist circuitry.

Figure 6A:
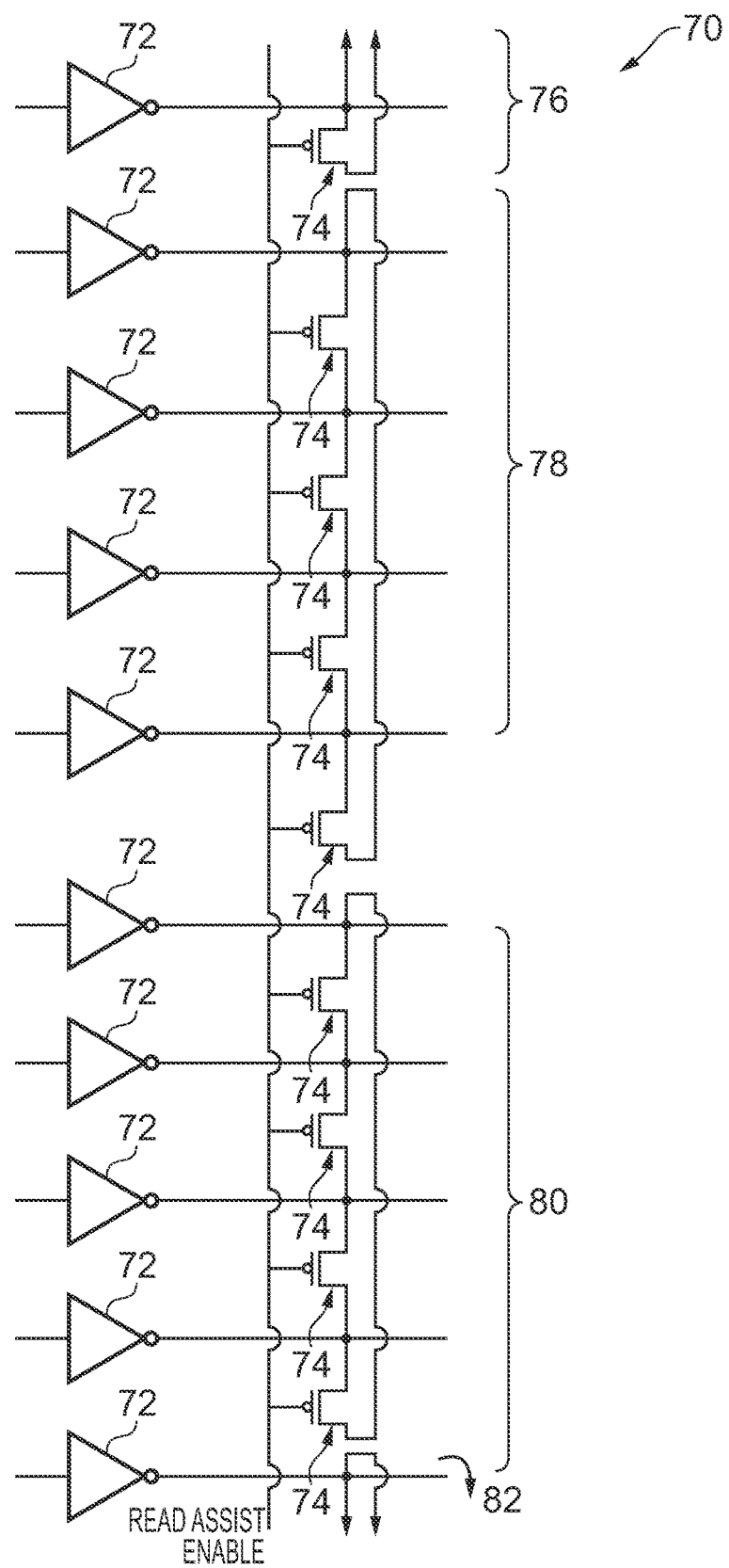
FIG. 6A schematically illustrates the configuration of an embodiment in which wordlines are grouped together as a set of four for connection to the read assist circuitry.

FIG. 6A schematically illustrates inverters 72 (forming part of respective wordline drivers) and PMOS transistors 74 in a configuration in which the PMOS transistors 74 which couple the wordlines together do so in a cyclical fashion in which groups of four wordlines are coupled together by respective PMOS transistors. In the set of wordlines illustrated in FIG. 6A, groups of wordlines 76, 78, 80 and 82 can be seen (at least in part). This cyclical configuration of the coupling together of wordlines, such that the bottom wordline in a group is connected to the top wordline in a group, means that potential issues with wordlines lying at the boundary of the memory device or at a sub-boundary within the device (e.g. at the boundary of a bank) are avoided since the logical configuration of the coupling of every wordline in the device is then the same. It should be appreciated that alternative configurations in which the number of wordlines in a cyclical group differs from that illustrated in FIG. 6A are also contemplated and are within the scope of the present invention, as long as that group comprises at least three. However, the groups of four shown in FIG. 6A lend themselves well to implementation in a contemporary memory device layout where a group of four allows useful repetition, scaling and hierarchical structuring to be performed according to typical contemporary techniques for various components of a memory device.

Figure 6B:
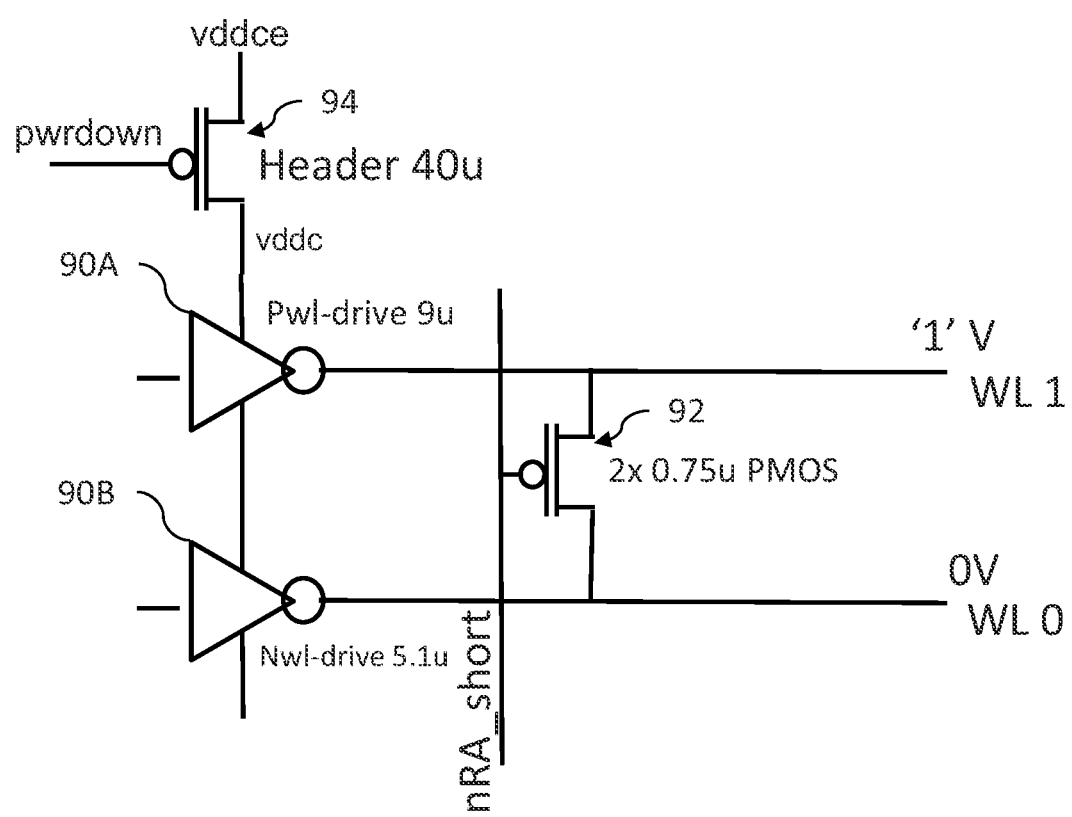
FIG. 6B schematically illustrates the configuration of two wordlines and the associated read assist circuitry in one embodiment.

Read assist circuitry can be designed to be even simpler than what is disclosed above in FIG. 4A and FIG. 6A. For instance, FIG. 6B shows the simplest application of this type of read assist, which is accomplished by placing one PMOS transistor between the word line and only one of its neighboring word lines. The solution shown in FIG. 6B may cause twice as much disturbance on the neighboring word line, however, an advantage provided by this design is that this design may be the simplest. Furthermore, when a memory has a number of rows, which are not dividable by four, the cyclical method, mentioned above and depicted in FIG. 6A, may not work. In that case, this solution illustrated in FIG. 6B can be used. In this manner, FIG. 6B shows one implementation of the simplest read assist solution.

FIG. 6B schematically illustrates a configuration of a portion of a memory device in accordance with various embodiments described herein. Two wordlines (WL0, WL1) are shown, each controlling an access to a respective set of bit cells. Each wordline is controlled by a wordline driver 90A, 90B, which asserts a voltage (e.g., WL1='1'V and WL0=0V) on the respective wordline to enable that access to occur. The configuration shown also comprises at least one PMOS transistor 92 which forms part of the read assist circuitry for this memory device and selectively connects the wordlines to one another. The gate of the PMOS transistor 92 is coupled to a line which carries the read assist enable signal (nRA_short) by means of which the selective connection between the wordlines can be made.

FIG. 6B further illustrates PMOS transistor 94, which acts as a header transistor for the illustrated set of wordline drivers to let them be enabled and disabled as a group. This header transistor 94 may be controlled by a header control signal pwrdown, which may be provided by a centralized control unit such as the control unit 42 shown in FIG. 3. Header transistor 94 is coupled to Vddce and provides Vddc to word drivers 90A, 90B.

In one embodiment, the PMOS transistor 94 is represented by a 40.mu. PMOS, while a PMOS transistor in one of the wordline drivers 90A is represented by a 9.mu. PMOS (Pwl-drive). It should be noted again that the references to the sizes of components here (e.g. "40.mu.") are to transistor width and not to resistance. Accordingly, a larger value here corresponds to greater conductance. A path from wordlines 90A, 90B is provided (e.g., to Vss (not shown)) by a 5.1.mu. NMOS transistor (Nwl-drive) in wordline 90B. The 2×0.75.mu. PMOS transistor 92 which embody the read assist selective control gate 92 in this embodiment are controlled by the read assist enable signal (nRA_short). While the read assist enable signal may be embodied as a binary (0/1) signal, it should be appreciated that it can be also implemented as an analogue signal. Then, either by varying (in design) the size of these transistors (resistors) or by varying their gate voltage, these "resistors" can be tuned to give a particular switching performance.

Figure 6C:
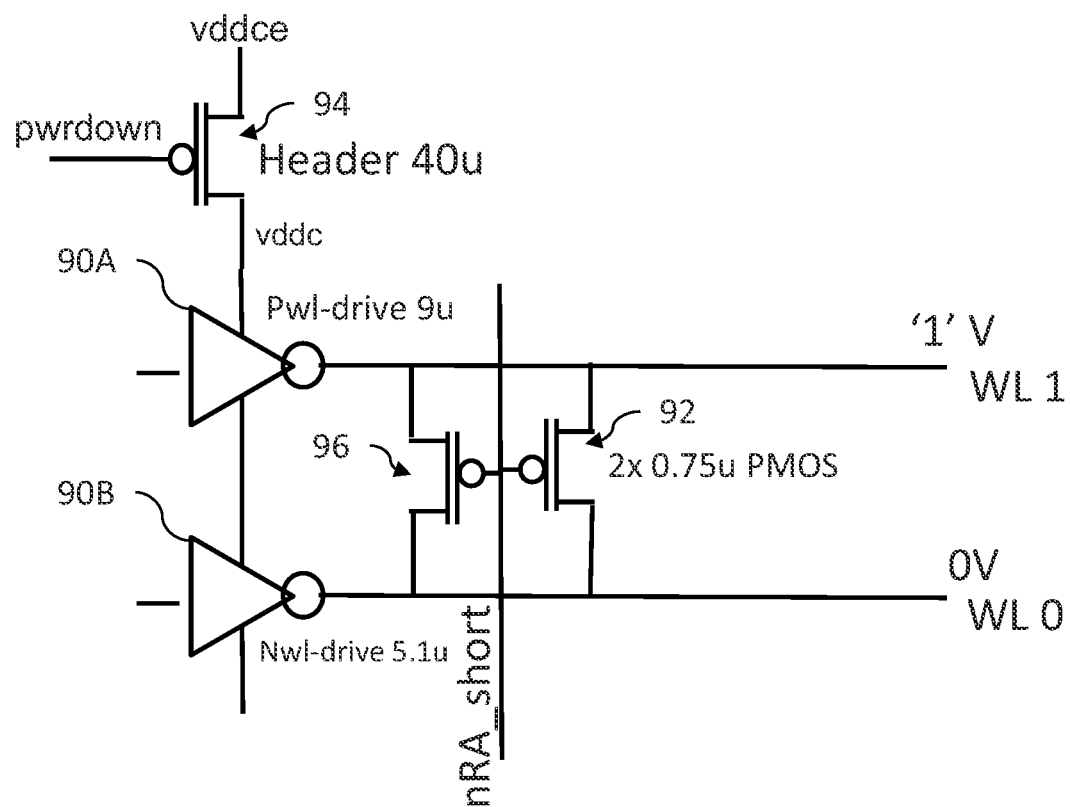
FIG. 6C schematically illustrates the configuration of two wordlines and the associated read assist circuitry in one embodiment.

FIG. 6C illustrates schematically illustrates another configuration of a portion of a memory device in accordance with various embodiments described herein. In FIG. 6C, there are two PMOS transistors 92, 96 that form part of the read assist circuitry for the memory device and selectively connect the wordlines to one another. The gates of each of the PMOS transistors are coupled to the line that carries that read assist enable signal (nRA_short). In this configuration, the '0' level may be attacked twice as heavy. A jump of 10 mV may be 20 mV. This configuration uses the same nra_short loading and is advantageous when used with step two memory compilers.

Figure 7:
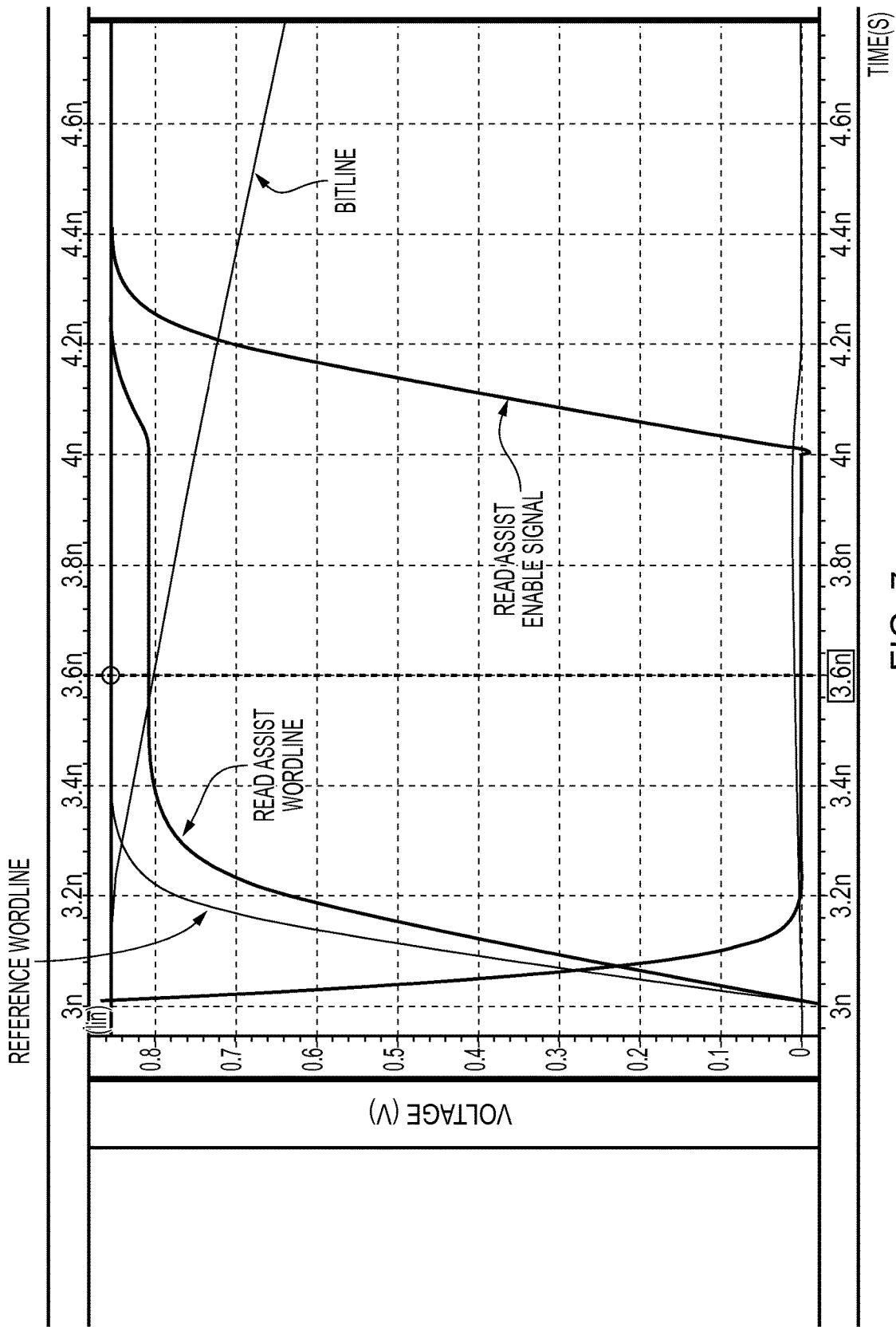
FIG. 7 shows the relative timing of wordline voltages, a bit line voltage and a read assist signal voltage in one embodiment.

FIG. 7 shows the relative timing of various signals in a simulation of one embodiment. The graph of FIG. 7 shows voltage (V) along a y-axis versus time(s) along an x-axis.

Figure 9:
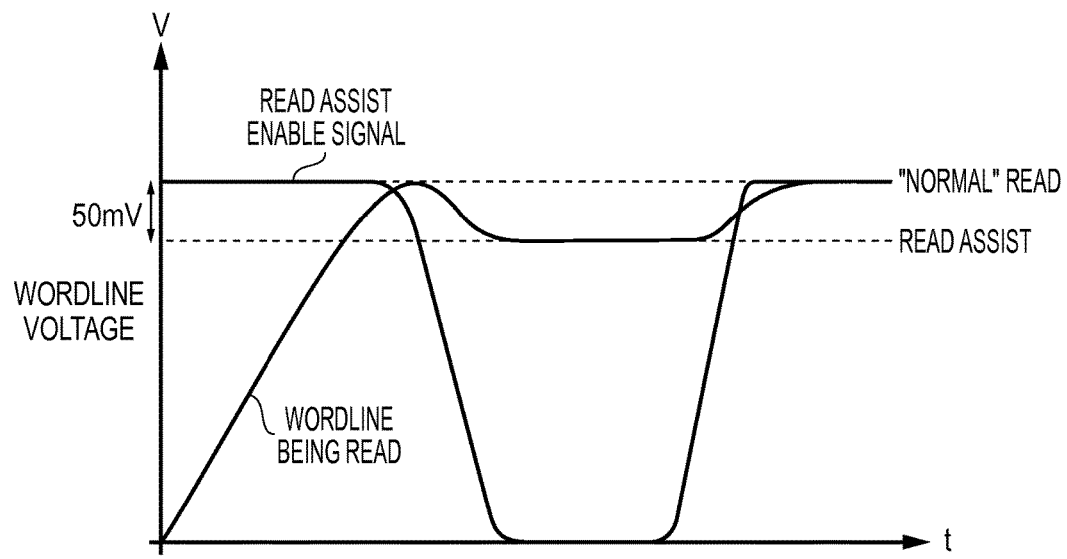
FIG. 9 illustrates the correction of an overshoot in the wordline voltage following the late assertion of the read assist signal in one embodiment.

The voltage evolution of a reference wordline (i.e. to which read assist techniques are not applied in this instance), a wordline to which read assist techniques are applied, a bitline voltage and the voltage of the read assist enable signal are shown. The assertion (low) of the read assist enable signal causes the divergence between the read assist wordline voltage and the reference wordline voltage, i.e. causes a reduction in the asserted voltage on the relevant wordline being read accessed. It should be appreciated that the timing of when the read assist enable signal is asserted is not critical to the operation of the read assist circuitry of the present techniques. Whilst the signal certainly needs to be asserted early enough for the required read assist reduction in the asserted voltage to take place, there is in principle no limit on how early the read assist enable signal must be asserted since if it is asserted before the relevant wordline is itself asserted then no significant negative effect ensues (other than a very small additional current consumption). Moreover, the read assist enable signal can also be safely asserted somewhat late, since although the duration of the read assist reduction in the wordline voltage will be diminished, the voltage on the relevant wordline being read will rapidly correct to the desired reduced (read assisted) level. This is illustrated in FIG. 9 and briefly discussed below. Leaving the read assist enable signal asserted (low) for too long does cost some energy and slow down the memory a little, but correct timing of such a read assist enable signal is known in the art and does not represent an implementational challenge for the present techniques.

Figure 8:
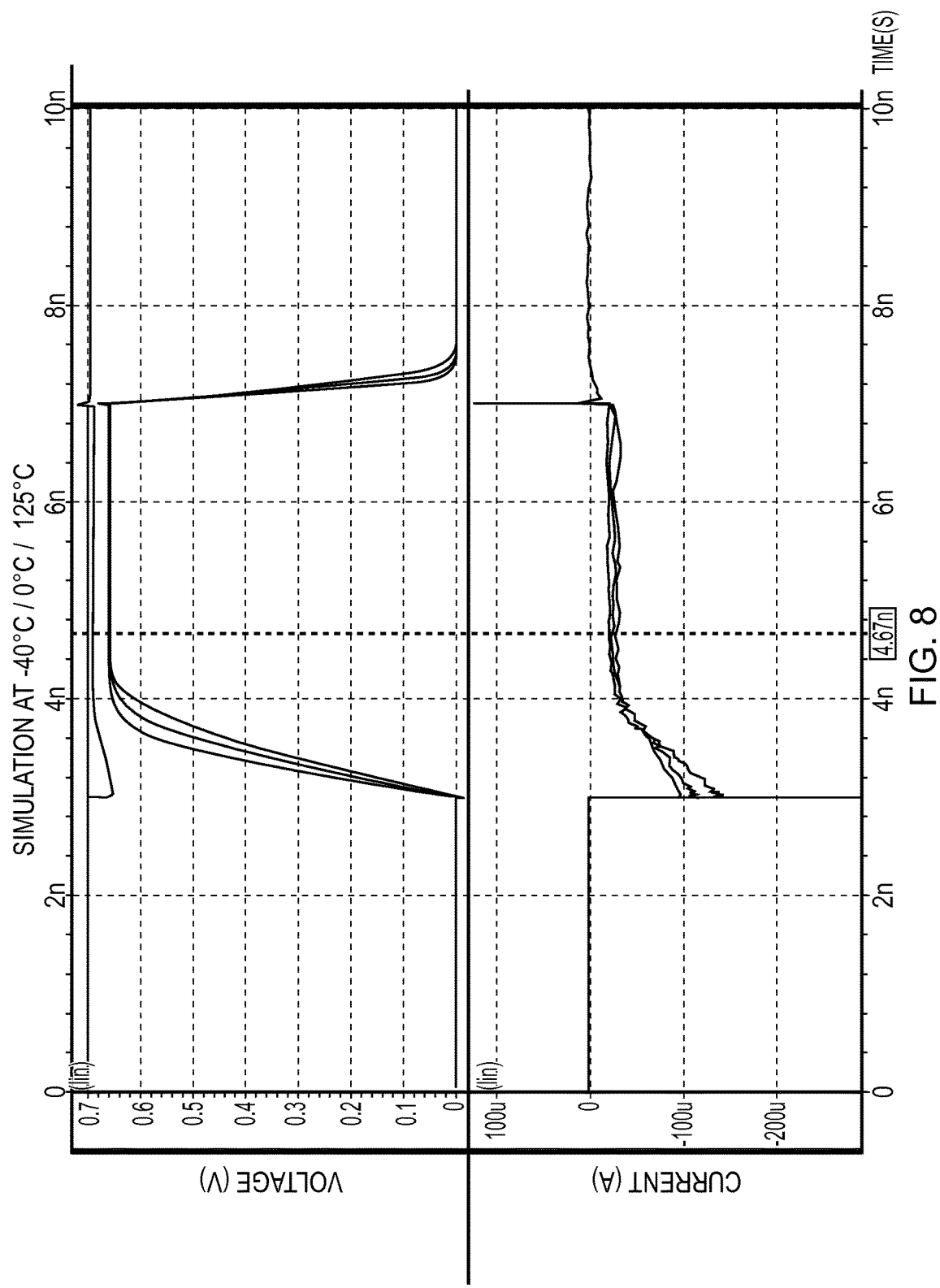
FIG. 8 shows the stability of the read assist technique of one embodiment with respect to temperature variation and also shows the modest current consumption of the read assist circuitry in that embodiment.

FIG. 8 shows some further characteristics of a simulation of one embodiment, in particular, in the upper plot showing the limited effect that ambient temperatures of −40.degree. C., 0.degree. C. and 125.degree. C. have on the read assist wordline voltage (for which, once plateaued, there is only a 1-2 mV difference in voltage). The lower plots shows that the current consumption for the read assist duration is only of the order of 20.mu.A. The graph of FIG. 8 shows voltage (V) and current (A) along a y-axis versus time(s) along an x-axis.

As mentioned above, voltage is asserted on a relevant wordline being read, and FIG. 9 shows the manner in which the present techniques allow the wordline (WL) voltage (V) to rapidly correct from a "normal" read level to the desired reduced read assist level when the read assist enable signal is asserted late. It can be seen that the wordline (WL) voltage (V) is already above the read assist level when the read assist enable single is asserted, but this then causes the wordline (WL) voltage (V) to rapidly correct downwards to the desired read assist level. The graph of FIG. 9 shows wordline (WL) voltage (V) along a y-axis versus time (t) along an x-axis.

Figure 10:
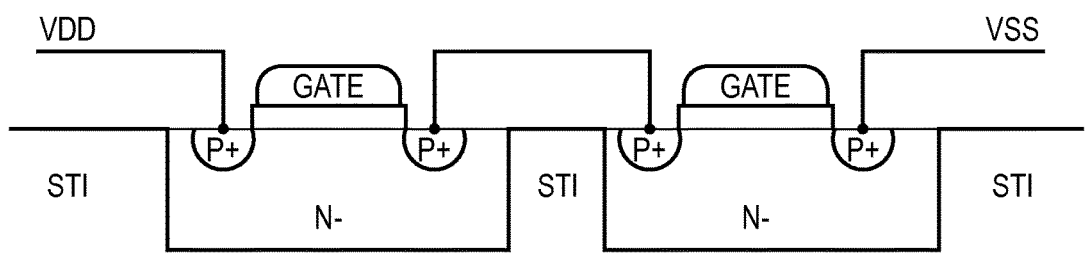
FIG. 10 schematically illustrates a cross section through the silicon implementation of a portion of a voltage divider in one embodiment.

FIG. 10 schematically illustrates a cross sectional view through an implementation in silicon of part of one embodiment, in particular showing the separation of two transistors to have distinct, separate wells, e.g., P+ and N−. This may be applied in the context of, for example, the lower most PMOS transistor 52 shown in FIG. 4A and its role in a voltage divider provided by a PMOS transistor in the inverter in wordline driver 50C and the NMOS transistor (tied high) coupling to VSS. This is in particular so that a direct path via a single transistor well is not provided between VDD and VSS, because although this path would be in principle protected by the gate in one transistor, such configuration would be ESD unsafe, in that a transient high voltage could cause the gate to open and connect VDD to VSS with catastrophic consequences for the components in this region of the memory device. The configuration shown in FIG. 10, where two transistors are separated by an isolating shallow trench isolation (STI) portion of the device, protects against such ESD sensitivity.

Figure 11:
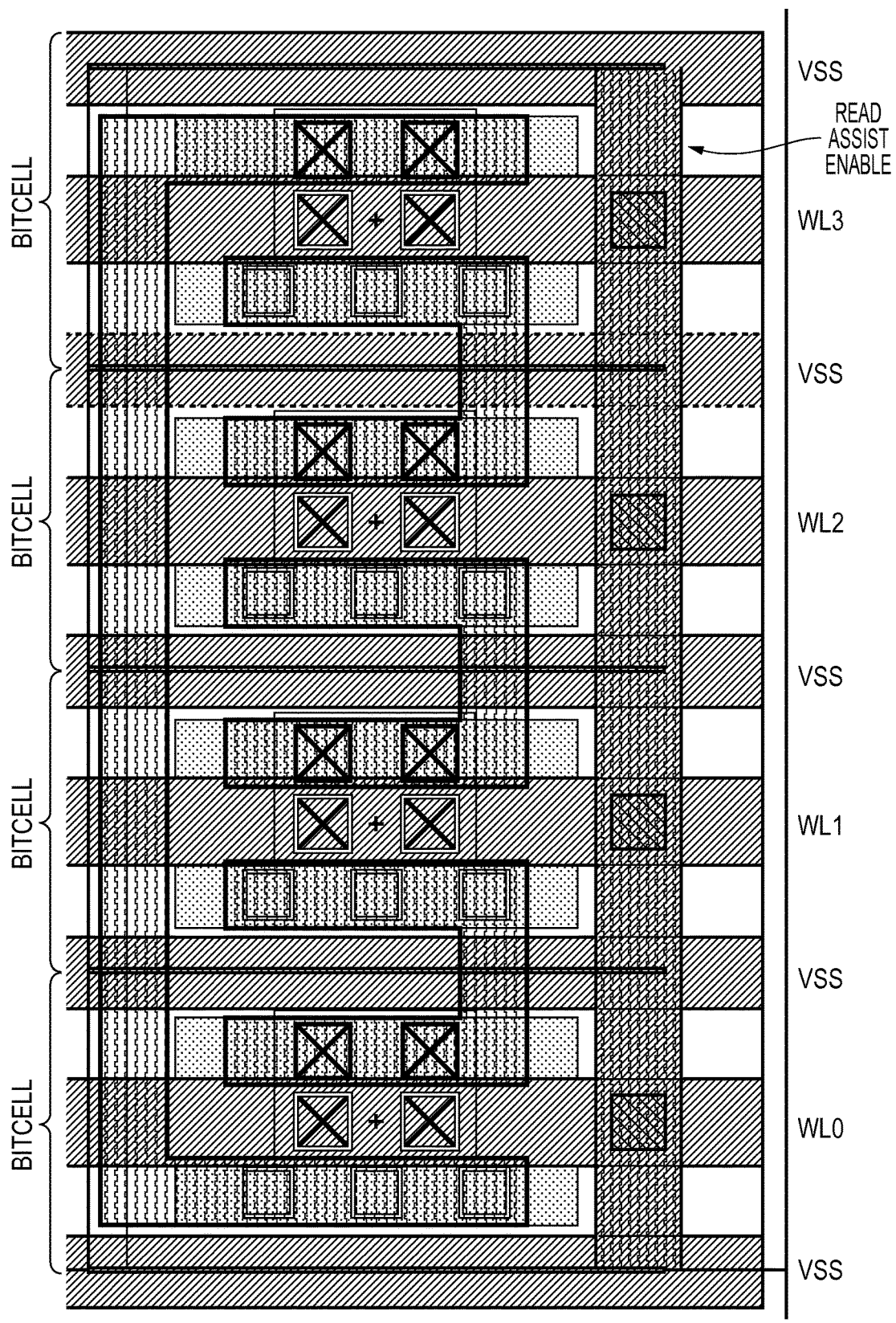
FIG. 11 schematically illustrates an example layout of a portion of a memory device in one embodiment.

FIG. 11 shows an example layout of a portion of a memory device in one embodiment. This portion can be seen to be formed of four bitcells, which have been grouped together in the above-described "cyclical" configuration, where the wordline (WL3) of the uppermost bitcell is selectively coupled to the wordline (WL0) of the lowermost bitcell. The read assist enable signal line can be seen running vertically down the right-hand side of the layout. The particularly compact layout is evident.

Figure 12:
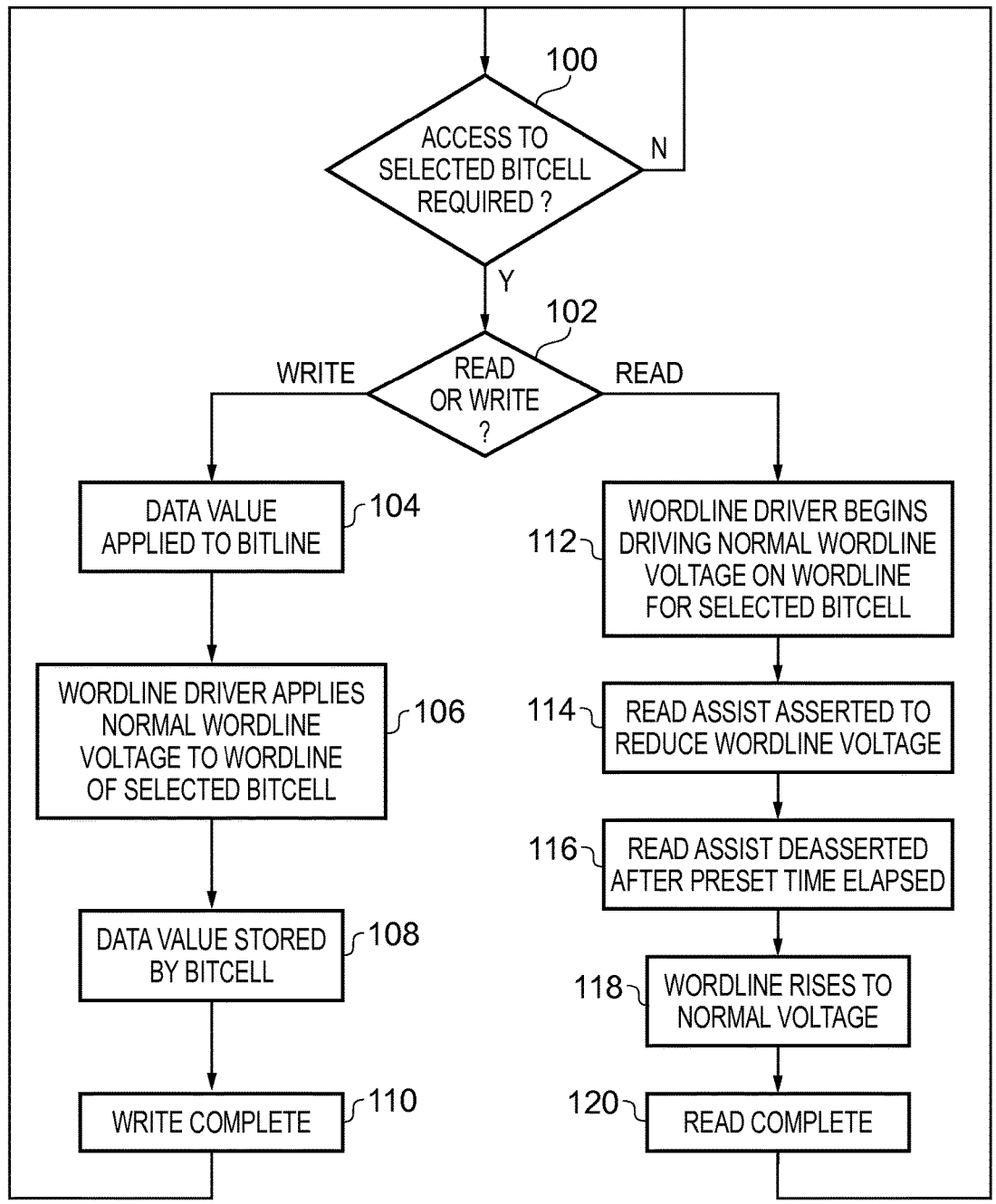
FIG. 12 schematically illustrates a sequence of steps which are taken in the method of one embodiment.

FIG. 12 schematically illustrates a sequence of steps which are taken in one embodiment. For simplicity of discussion these steps are described with respect to a MUX-1 configuration (i.e. with only single bitcell and bitline being mentioned). The flow can be considered to begin at step 100, where it is determined if access to a selected bit cell of the memory device is required. Whilst it is not, the flow loops upon itself at this step. When such access is required then at step 102 it is determined whether this is a read access or a write access. If a write access is required then the flow proceeds down the left hand branch via step 104, where the data value to be written is applied to the bit line associated with the selected bit cell. Then at step 106 the wordline driver for the wordline which is associated with this associated bit cell begins applying the normal wordline voltage to that wordline. As a result, step 108 the data value is stored by the bit cell and step 110 the write access can be considered to be complete and the flow returns to step 100. Alternatively, if at step 102 it is determined that a read access is required then the flow proceeds via the right hand path and at step 112 the wordline driver begins driving the normal wordline voltage on the wordline for the selected bit cell. Then (subject to the timing constraints to discuss for example with respect to FIG. 7), the read assist signal is asserted (active low) at step 114 to hold this wordline voltage at a reduced level. At step 116 the read assist signal is deasserted (returned high) after a preset time has elapsed for which this wordline voltage reduction is desired and at step 118 the wordline voltage rises to the normal voltage. Over the course of the steps 112, 114, 116 and 118 the data value stored in the selected bit cell causes a change in voltage and on the bit line associated with a selected bit cell which can be read out via the relevant sense amplifier. The read process can then be considered to be completed at step 120 and the flow returns to step 100.

Figure 13:
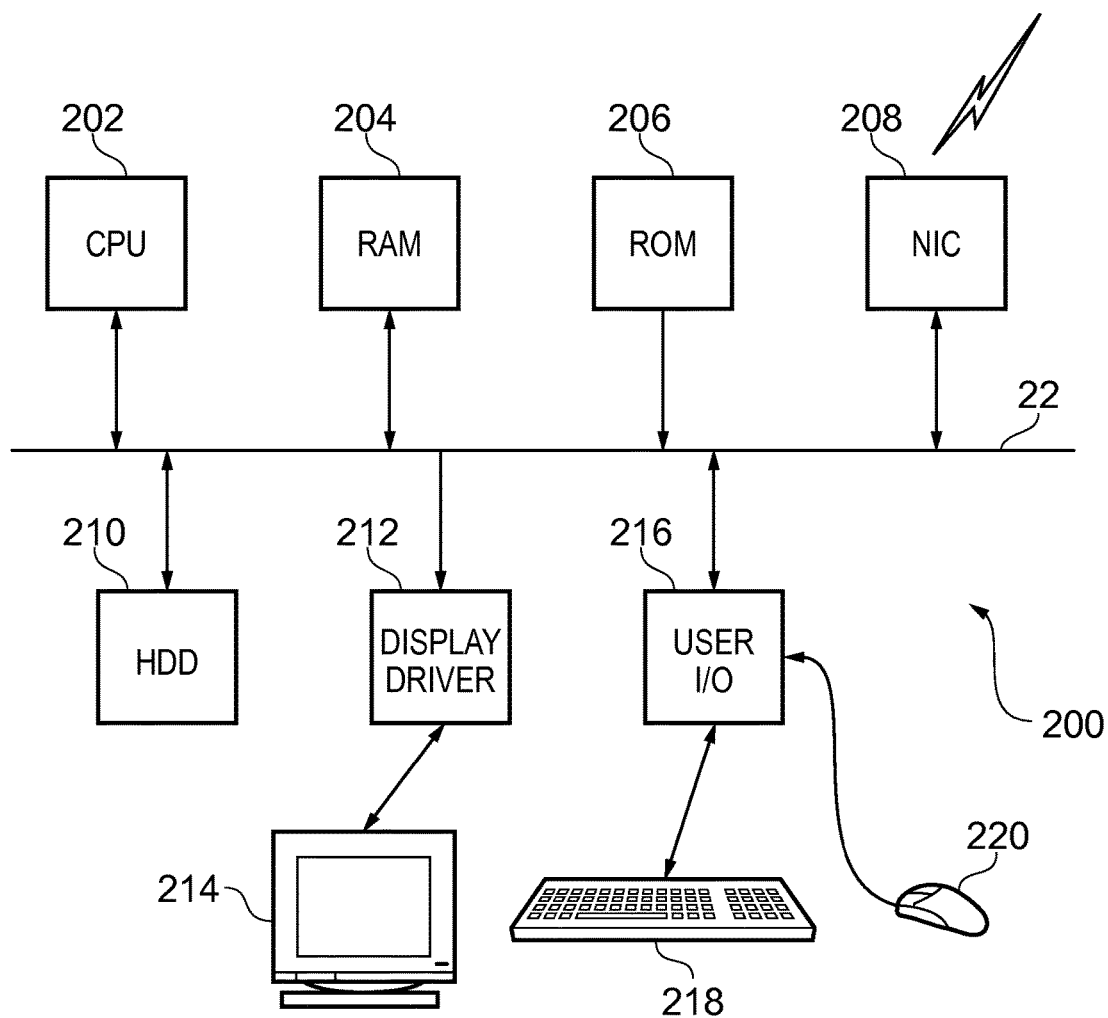
FIG. 13 schematically illustrates a general purpose computing device on which the present techniques are implemented in one embodiment.

FIG. 13 schematically illustrates a general purpose computing device 200 of the type that may be used to implement the above described techniques. The general purpose computing device 200 includes a central processing unit 202, a random access memory 204 and a read only memory 206, connected together via bus 22. It also further comprises a network interface card 208, a hard disk drive 210, a display driver 212 and monitor 214 and a user input/output circuit 216 with a keyboard 218 and mouse 220 all connected via the common bus 22. In operation, such as when executing data processing instructions which include an instruction configured to cause the device to carry out the present techniques, the central processing unit 202 will execute computer program instructions that may for example be stored in the random access memory 204 and/or the read only memory 206. Program instructions could be additionally retrieved from the hard disk drive 210 or dynamically downloaded via the network interface card 208. The results of the processing performed may be displayed to a user via a connected display driver 212 and monitor 214. User inputs for controlling the operation of the general purpose computing device 200 may be received via a connected user input output circuit 216 from the keyboard 218 or the mouse 220. It will be appreciated that the computer program could be written in a variety of different computer languages. The computer program may be stored locally on a recording medium or dynamically downloaded to the general purpose computing device 200. Hence for example, when operating under control of an appropriate computer program, the general purpose computing device 200 can provide a memory compiler which generates a particular layout of a memory device in dependence on various settings and that memory device can be in accordance with the techniques described herein. The layout may be generated in a variety of different data formats. In generating the layout the memory compiler may reference a number of cell libraries which include cell definitions (definitions of units which may be repeatedly used in the layout) and according to the present techniques at least one of those cell definitions can be for a memory bitcell in accordance with the present techniques. The library and/or cell definition can be stored in any of the above-mentioned locations where a computer program can be stored/retrieved from. The general purpose computing device 200 can thus implement the above described techniques and can be considered to form an apparatus for performing the above described techniques. The architecture of the general purpose computing device 200 could vary considerably and FIG. 13 is only one example.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

The invention claimed is:
1. A memory device comprising:
an array of bitcells;
a plurality of wordline drivers coupled to the array of bitcells via a plurality of wordlines, wherein each bitcell of the array of bitcells is selectively coupled to a wordline driver of the plurality of wordline drivers via a wordline of the plurality of wordlines and access to a selected bitcell of the array of bitcells uses an asserted voltage on a selected wordline with which the selected bitcell is associated, and wherein each wordline driver has a NAND gate and an inverter coupled to each bitcell of the array of bitcells via a corresponding wordline of the plurality of wordlines to provide the asserted voltage on the selected wordline; and
a read assist circuitry configured, when read access to the selected bitcell is carried out, to implement a reduction in the asserted voltage on the selected wordline,
wherein the read assist circuitry is configured to implement the reduction in the asserted voltage by utilizing the inverters of the wordline drivers and selectable connections between adjacent wordlines together with a read assist enable signal, and
wherein the selectable connections comprise p-type metal-oxide-semiconductor (PMOS) transistors activated based on the read assist enable signal.

2. The memory device as claimed in claim 1, wherein the read assist circuitry is configured to implement the reduction in the asserted voltage on the selected wordline by an additional selective connection of the selected wordline to a second further wordline of the plurality of wordlines.

3. The memory device as claimed in claim 2, wherein the second further wordline of the plurality of wordlines is adjacent to the selected wordline.

4. The memory device as claimed in claim 2, wherein the read assist circuitry further comprises a selectable connection between the further wordline and the second further wordline of the plurality of wordlines.

5. The memory device as claimed in claim 1, wherein a further wordline of the plurality of wordlines is adjacent to the selected wordline, and wherein the selectable connections between adjacent wordlines include a selective connection of the selected wordline to the further wordline of the plurality of wordlines.

6. The memory device as claimed in claim 1, wherein the read assist circuitry comprises a set of selectable connections between adjacent wordlines of a set of at least three adjacent wordlines, wherein the set comprises the selected wordline and the read assist circuitry comprises a further selectable connection between two outermost wordlines in the set.

7. The memory device as claimed in claim 6, wherein the set of at least three adjacent wordlines is a set of four adjacent wordlines.

8. The memory device as claimed in claim 1, wherein the selective connection of the selected wordline to a further wordline of the plurality of wordlines is controlled by a control signal provided externally to the memory device.

9. The memory device as claimed in claim 1, wherein the read assist circuitry is coupled to a line that carries the read assist enable signal.

10. The memory device as claimed in claim 1, wherein the read assist enable signal comprises an active low signal.

11. A memory bitcell comprising:
a data-bit storage circuitry;
a wordline driver coupled to a memory bitcell via a wordline, wherein the data-bit storage circuitry is configured to be selectively coupled to the wordline driver via the wordline and access to the memory bitcell uses an asserted voltage on the wordline, and wherein the wordline driver has a NAND gate and an inverter coupled to the bitcell via the wordline to provide the asserted voltage on the selected wordline; and
a read assist circuitry configured, when a read access to the memory bitcell is carried out, to implement a reduction in the asserted voltage on the wordline,
wherein the read assist circuitry is configured to implement the reduction in the asserted voltage by utilizing the inverter of the wordline driver and a selective connection of the wordline to an adjacent wordline together with a read assist enable signal, and
wherein the selective connection comprises a p-type metal-oxide-semiconductor (PMOS) transistor activated based on the read assist enable signal.

12. A method of operating a memory device comprising:
storing data in an array of bitcells;
coupling a wordline driver to a selected wordline from amongst a plurality of wordlines to a selected bitcell of the array of bitcells when access to the selected bitcell is asserted, wherein the wordline driver has a NAND gate and an inverter coupled to the selected bitcell via the selected wordline;
applying an asserted voltage on the selected wordline;
implementing, when a read access to the selected bitcell is carried out, a reduction in the asserted voltage on the selected wordline,
wherein the reduction in the asserted voltage is implemented by utilizing the inverter of the wordline driver and a selective connection of the selected wordline to an adjacent wordline of the plurality of wordlines together with a read assist enable signal, and
wherein the selective connection comprises a p-type metal-oxide-semiconductor (PMOS) transistor activated based on the read assist enable signal.

13. A memory device comprising:
means for storing data in an array of bitcells;
means for coupling a wordline driver to a selected wordline from amongst a plurality of wordlines to a selected bitcell of the array of bitcells when access to the selected bitcell is asserted, wherein the wordline driver has a NAND gate and an inverter coupled to the selected bitcell via the selected wordline;
means for applying an asserted voltage on the selected wordline;
means for implementing, when a read access to the selected bitcell is carried out, a reduction in the asserted voltage on the selected wordline,
wherein the reduction in the asserted voltage is implemented by utilizing the inverter of the wordline driver and a selective connection of the selected wordline to an adjacent wordline of the plurality of wordlines together with a read assist enable signal, and
wherein the selective connection comprises a p-type metal-oxide-semiconductor (PMOS) transistor activated based on the read assist enable signal.

* * * * *